(12) United States Patent
West et al.

(10) Patent No.: US 8,097,964 B2
(45) Date of Patent: Jan. 17, 2012

(54) IC HAVING TSV ARRAYS WITH REDUCED TSV INDUCED STRESS

(75) Inventors: Jeffrey Alan West, Dallas, TX (US); Margaret Rose Simmons-Matthews, Richardson, TX (US); Masazumi Amagai, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 225 days.

(21) Appl. No.: 12/648,871

(22) Filed: Dec. 29, 2009

(65) Prior Publication Data

US 2010/0171226 A1    Jul. 8, 2010

Related U.S. Application Data

(60) Provisional application No. 61/141,136, filed on Dec. 29, 2008.

(51) Int. Cl.
*H01L 23/48* (2006.01)
*H01L 23/52* (2006.01)
*H01L 29/40* (2006.01)

(52) U.S. Cl. ...................... 257/786; 257/698
(58) Field of Classification Search ................. 257/786, 257/784, 698, 622
See application file for complete search history.

(56) References Cited

U.S. PATENT DOCUMENTS

| 6,285,560 | B1 | 9/2001 | Lyne | |
|---|---|---|---|---|
| 2010/0252934 | A1* | 10/2010 | Law et al. | 257/774 |
| 2011/0140281 | A1* | 6/2011 | Sekine et al. | 257/774 |
| 2011/0186990 | A1* | 8/2011 | Mawatari et al. | 257/737 |
| 2011/0193212 | A1* | 8/2011 | Gu et al. | 257/686 |
| 2011/0193228 | A1* | 8/2011 | Yu et al. | 257/738 |

* cited by examiner

*Primary Examiner* — Sheila V. Clark
(74) *Attorney, Agent, or Firm* — Steven A. Shaw; W. James Brady; Frederick J. Telecky, Jr.

(57) ABSTRACT

An integrated circuit (IC) includes a substrate having a top side having active circuitry thereon including a plurality of metal interconnect levels including a first metal interconnect level and a top metal interconnect level, and a bottom side. At least one TSV array includes a plurality of TSVs. The TSVs are positioned in rows including a plurality of interior rows and a pair of exterior rows and a plurality of columns including a plurality of interior columns and a pair of exterior columns. At least a portion of the TSVs in the array are electrically connected TSVs that are coupled to a TSV terminating metal interconnect level selected from the plurality of metal interconnect levels. At least one of the exterior rows or exterior columns include a lower number of electrically connected TSVs compared to a maximum number of electrically connected TSVs in the interior rows and interior columns, respectively.

17 Claims, 6 Drawing Sheets

IC HAVING TSV ARRAYS WITH REDUCED TSV INDUCED STRESS

CROSS REFERENCE TO RELATED APPLICATIONS

This application claims the benefit of Provisional Application Ser. No. 61/141,136 entitled "Method for Reducing Stress Imparted to Integrated Circuits by Through Silicon Vias (TSVs), filed Dec. 29, 2008, which is herein incorporated by reference in its entirety.

FIELD

Disclosed embodiments generally relate to IC devices having through-substrate vias.

BACKGROUND

Vias are routinely used in forming ICs. Vias may be formed that extend vertically from the bottom side of an IC die to one of the metal interconnect layers on the active top side of the IC die. Such structures are often referred to as "through-silicon vias", and are referred to more generally herein as through-substrate vias (TSVs).

TSVs are generally framed by a dielectric liner and filled with copper or another electrically conductive TSV filler material to provide the desired low resistance vertical electrical connection. A diffusion barrier metal formed on the dielectric liner frames the TSV and protects against escape of the TSV filler material into the substrate in the case of highly mobile metal TSV filler materials that are known to significantly reduce minority carrier lifetimes, such as copper in silicon, that cause problems such as significantly increased junction leakage or a shift in transistor threshold voltage.

Copper, as well as some other TSV filler materials, have a significantly higher coefficient of thermal expansion (CTE) as compared to conventional IC substrates, such as silicon. For example, copper has a CTE of approximately 17 ppm/°C., whereas silicon has a CTE of approximately 2 to 3 ppm/°C. This CTE mismatch ($\Delta$CTE) can result in significant thermally induced stress in the silicon including the circuitry (e.g. MOS transistors) in the silicon surrounding the TSVs, particularly during certain fab processing subsequent to the fabrication of the TSV (e.g., 360 to 410° C. sinters), during assembly and test/operations as may occur during solder reflow (e.g., up to about 260° C.) or during thermo-compressive bonding (e.g., up to 400° C.), during certain temperature cycle reliability testing (e.g., −55° C. to 125° C.), or even during long-term field operation of the IC.

A number of solutions have been proposed to reduce problems caused by CTE mismatches for ICs having copper TSVs. In some IC designs, to reduce stress, TSVs are positioned in TSV arrays comprising a plurality of TSVs. For example, reducing the TSV diameter and increasing TSV spacing (i.e. pitch) generally reduces stress. Another known option to reduce stress is to use a TSV filler material that provides a lower $\Delta$CTE relative to the substrate, such as tungsten instead of copper.

SUMMARY

The Inventors have recognized TSV arrays that have large $\Delta$CTE between the embedded TSV metal and the substrate impart the maximum stress on the surrounding substrate/die near the corners of commonly used rectangular TSV arrays. Copper TSVs embedded in silicon substrates is one example of an arrangement that results in a large $\Delta$CTE between the TSV metal and the substrate. Stress induced fractures of the substrate containing the embedded TSVs during temperature cycling has led to reliability problems and has caused some designs to use tungsten TSVs to reduce the CTE differential which reduces cracking but also adversely affects performance (e.g. speed) of the IC due to an approximately 5× increase in resistivity compared to copper TVSs.

Disclosed ICs include at least one TSV array comprising a plurality of TSVs positioned in rows including a plurality of interior rows and a pair of exterior rows, and a plurality of columns including a plurality of interior columns and a pair of exterior columns. At least a portion of the plurality of TSVs in the array are electrically connected (i.e. active) TSVs that are coupled to a TSV terminating metal interconnect level selected from one of the IC's plurality of metal interconnect levels. At least one of the pair of exterior rows or pair of exterior columns includes a lower number of electrically connected TSVs compared to a maximum number of electrically connected TSVs in the plurality of interior rows and plurality of interior columns, respectively.

In one embodiment, the TSV array includes selective removal of at least one electrically connected TSV from the corners of the TSV arrays (referred to herein as "depopulation", forming "depopulated locations" or depopulated regions"). In another embodiment, the TSV array includes at least one and more typically a region comprising a plurality of non-electrically functioning TSVs (termed herein "dummy TSVs"). Dummy TSVs can serve as sacrificial stress absorbers. The depopulation and dummy TSV embodiments may be combined. Disclosed embodiments enable TSV arrays having a larger area (i.e. and thus lower resistance), enable a larger operating temperature range for the IC, and can remove the need or motivation to substitute a higher resistivity TSV metal (e.g. tungsten) for copper to reduce stress induced cracking of the substrate.

DETAILED DESCRIPTION

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

Disclosed embodiments include ICs having TSV arrays that provide reduced CTE-induced peak stress as compared to conventional TSV arrays. As described above, TSV arrays, particularly when silicon, silicon-germanium or germanium is filled with copper, impart a maximum ΔCTE-based stress on the surrounding substrate/die at the corners of the TSV arrays during thermal cycling. In worst-cases, this can lead to fracture of the substrate containing the TSV array near the corner of the array or failure of one or more bonds involving the TSVs, such as at the TSV tip comprising bonds to a die mounted above. In best cases, this leads to a larger keep out zone for placement of stress-sensitive circuits relative to the TSV array corners.

By reducing peak stress, ICs comprising larger TSV arrays than can currently be reliably placed becomes possible, and the size of the keep out zone may also be reduced. Moreover, a larger operating temperature range may be enabled. Disclosed embodiments also enable the reliability of the TSV comprising IC to be improved without the need to substitute alternative metal filler materials such as tungsten for copper which can degrade performance of the IC. For example, other embodiments include copper in germanium and copper in silicon germanium. Tungsten TSVs in silicon can also benefit from embodiments of the invention.

Moreover, although TSV arrays are generally described herein as having rectangular shape and comprising silicon filled with copper, disclosed embodiments are not limited to rectangular shapes, nor to silicon comprising substrates filled with copper. Disclosed embodiments generally include any array shape containing a vertex of angle ≦90 degrees. For example, in one embodiment, the TSV array can be in the shape of a plus (+) sign.

One disclosed embodiment involves depopulating (i.e. omitting) TSVs at corners of the TSV arrays. By depopulating at least one TSV at the corners of the TSV array, the maximum stress imparted on the substrate by the TSV array is lowered. As a result, the package/device lifetime may be extended. Alternately, non-electrically connected (dummy) TSVs may be provided around the active portion of the TSV array, or used in combination with depopulation so that dummy TSVs may be provided to circumscribe a portion or the entire active portion of the TSV array while one or more TSVs may be depopulated at the TSV corners.

Figure 1A:
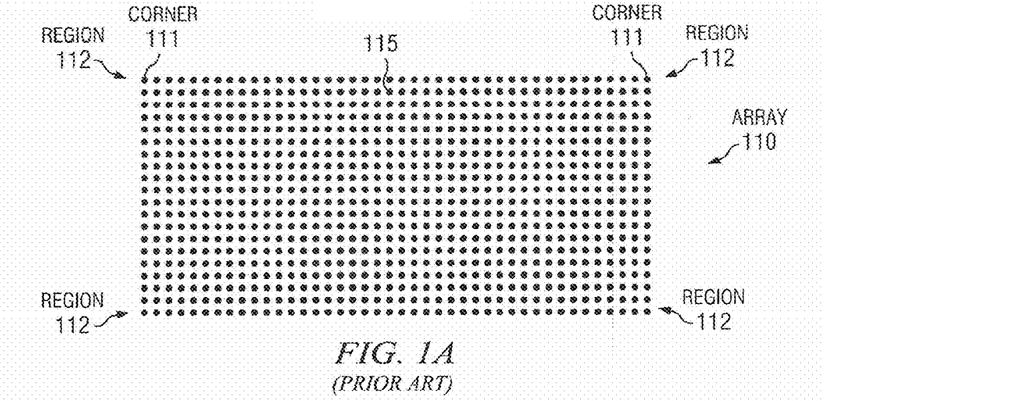
FIG. 1A shows a depiction of a conventional rectangular TSV array.

FIG. 1A shows a depiction of a conventional rectangular TSV array 110 comprising a plurality of rows and columns. The TSVs 115 can be copper filled TSVs formed in silicon, or be filled with other metals and/or other substrates. The regions 112 near corners 111 of the TSV array 110 are in a higher stress state as compared to the remainder of the TSV array 110. Although the TSVs shown herein are generally shown having a circular cross section, the vias can be square, octagonal, or slot-shaped (e.g., rectangular), as opposed to conventional circular vias. Slot-shaped vias, for example, can reduce the amount of Cu electroplating required to fill the TSV as compared to conventional circular cross sectioned vias.

Figure 1B:
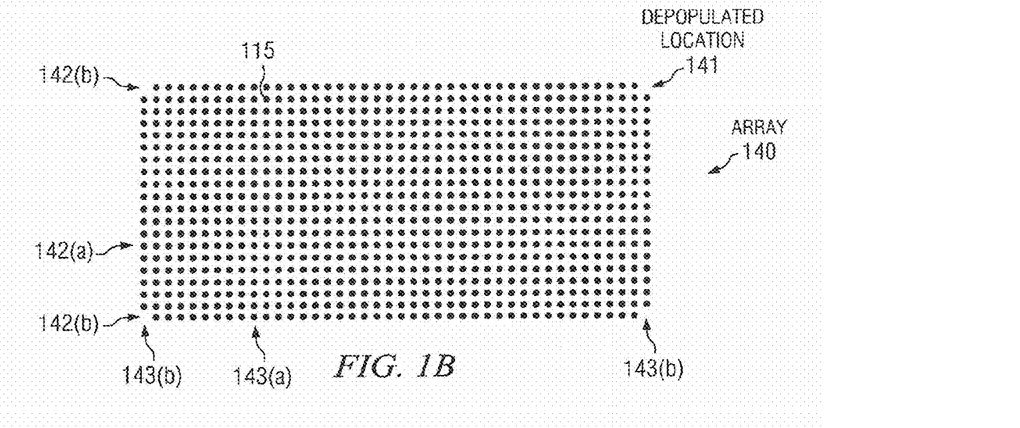
FIGS. 1B and C show depictions of exemplary selective depopulation-based TSV array designs according to disclosed embodiments including a modified rectangular TSV array with one TSV depopulated per corner, and a modified rectangular TSV array with a depopulated region comprising three TSVs depopulated per corner, respectively.
Figure 1C:
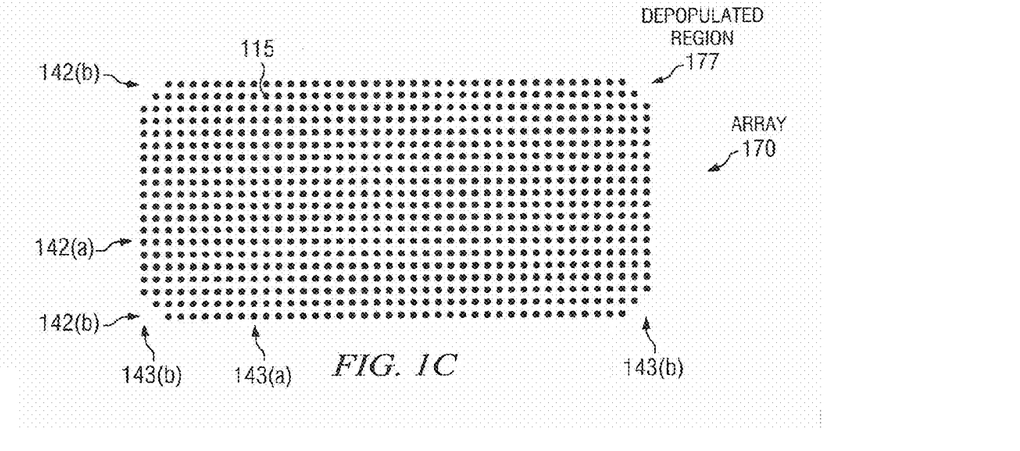

FIGS. 1B and 1C show depictions of exemplary selective depopulation TSV array designs 140 and 170, respectively, according to disclosed embodiments. Depopulated locations generally correspond to locations that do not receive TSV via etch and thus do not include a TSV filled with embedded metal. TSV array 140 shown in FIG. 1B is a rectangular TSV array modified to have one TSV depopulated from each of its four corners. Depopulated (i.e. omitted) array locations are shown by reference 141 that can be seen to be corner TSV array locations that are otherwise populated with a TSV that is identical to the other TSVs 115 in conventional rectangular TSV array 110 shown in FIG. 1A.

Depopulation disclosed herein can be used to minimize ΔCTE induced peak stress by "softening" or "rounding" the sharp corner features of the TSV array. Selective depopulation of a TSV array at the corners of the array serves to dampen the ΔCTE induced stress at the corners, thereby generally rendering the resulting IC including one or more TSV arrays more robust as to time/temperature cycling failures.

The plurality of TSVs in TSV array 140 are positioned in rows including a plurality of interior rows 142(a) and a pair of exterior rows 142(b) and a plurality of columns including a plurality of interior columns 143(a) and a pair of exterior columns 143(b). All the TSVs 115 shown in TSV array 140 are electrically connected (i.e. active) TSVs that are coupled to a TSV terminating metal interconnect level selected from the plurality of metal interconnect levels on the IC (not shown in FIG. 1B). Due to inclusion of depopulated locations 141 into TSV array 140, exterior rows 142(b) and exterior columns 143(b) include a lower number (i.e. 2 less) of electrically connected TSVs compared to a maximum number of electrically connected TSVs in the plurality of interior rows 142(a) and the plurality of interior columns 143(a), respectively.

TSV array 170 shown in FIG. 1C is a rectangular TSV array with three vias depopulated per corner to form depopulated array regions 177 in each corner, according to a disclosed embodiment. The array locations in depopulated array regions 177 are array locations that are populated with TSVs 115 in conventional rectangular TSV arrays, such as TSV array 110 shown in FIG. 1A.

As known in the art, the TSV die (or wafer) can be assembled top side (face) up or bottom side up (i.e. face down). In embodiments where the TSV die (or wafer) is assembled face down, such as being bonded to pads of a package (e.g. organic) substrate, at least one other die or wafer is bonded on top of the TSV die or wafer via the TSV tips of the TSV die or wafer, often including solder in the bonds. In this arrangement, the bonded tips are exposed to package stresses resulting from differences in thermal expansion of the various components comprising the assembled stack (also known as "3D-IC"), such as the organic substrate, the IC comprising the TSVs, and the die or wafer bonded to the TSVs, which itself may be a pre-assembled die or wafer stack. The maximum stress exists at the periphery of such stack assemblies. Such stress fields can cause the bonds involving the TSV tips at the periphery regions of embedded TSV arrays to fail, due to open or high resistance contacts at the TSV tip bonding locations.

In certain disclosed embodiments, at least one and generally a plurality of dummy TSVs as disclosed herein are positioned within an effective distance to the active portion of the TSV array to enable the dummy TSVs to act as sacrificial stress absorbers. Areas of dummy TSVs can serve as sacrificial stress absorbers, so that stress concentrations (i.e., peak stress due to ΔCTE) can be reduced. During time/temperature cycling of 3D-ICs containing embedded TSV arrays including dummy TSV features, the dummy TSVs can attenuate the stress field imparted to the active TSVs, thereby extending the reliability of the 3D-IC. The dummy TSVs can thus be placed on the TSV tip-connected side providing some stress relief to the interior neighbors in the TSV array.

As defined herein, an "effective distance" refers to a region that is defined from the outer edge of the active portion of the TSV array outward a distance extending to three (3) times the pitch of the TSVs 115 in the TSV array. For example, for a TSV array having a 40 μm pitch, the effective distance would extend outward from the edge of the active TSV array a distance of 120 μm.

Figure 2A:
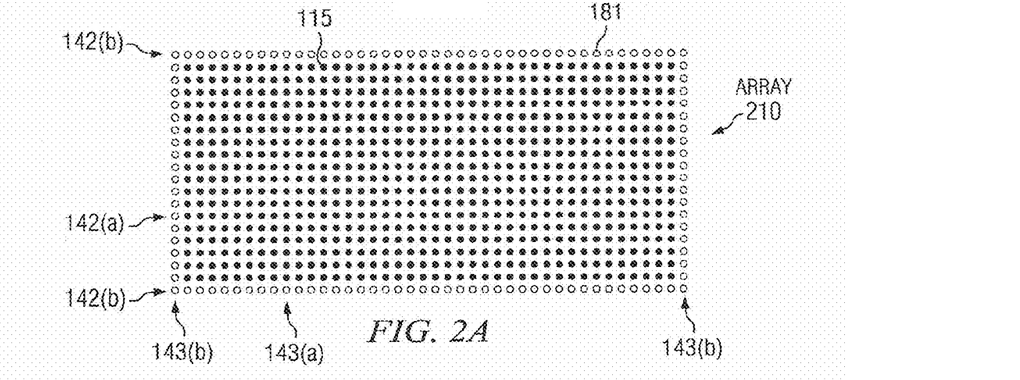
FIGS. 2A-C show depictions of a rectangular TSV array having its exterior rows and columns populated with dummy TSVs, a modified TSV array with one TSV depopulated per corner and dummy exterior TSV rows and exterior columns, and a modified TSV array with three TSV depopulated per corner and dummy exterior TSV rows and their neighboring rows as well as dummy exterior columns and their neighboring columns, respectively, according to disclosed embodiments.

FIG. 2A shows a depiction of a TSV array 210 having its exterior rows 142(b) and exterior columns 143(b) populated with dummy TSVs 181, according to a disclosed embodiment. Dummy TSVs 181 are depicted in FIG. 2A and throughout this Disclosure with open circles as opposed to conventional electrically connected (i.e. active) TSVs 115 that are depicted in FIG. 2A and throughout this Disclosure with solid circles.

Figure 2B:
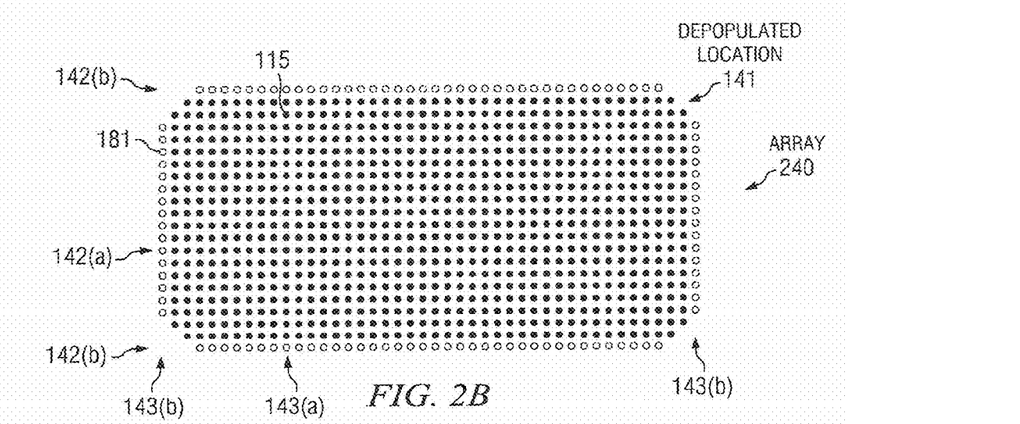
Figure 2C:
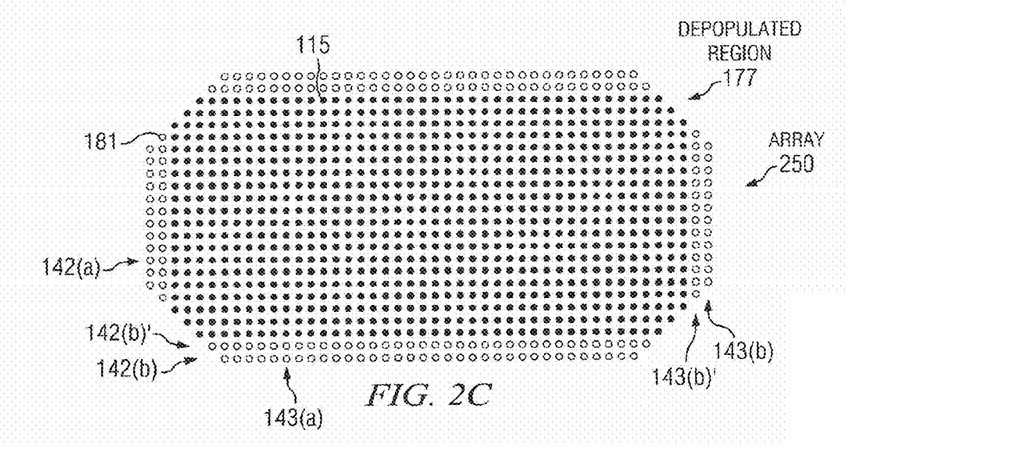

FIG. 2B shows a depictions of a TSV array 240 having one TSV depopulated per corner and its exterior rows 142(b) and exterior columns 143(b) populated with dummy TSVs 181, according to a disclosed embodiment. FIG. 2C shows a depiction of a TSV array 250 having depopulated array regions 177 in each corner comprising three TSV locations and dummy TSVs 181 positioned in exterior TSV rows 142(b) and for their nearest neighboring rows 142(b)', as well as dummy exterior columns 143(b) and for their neighboring columns 143(b)', according to a disclosed embodiment.

Figure 2D:
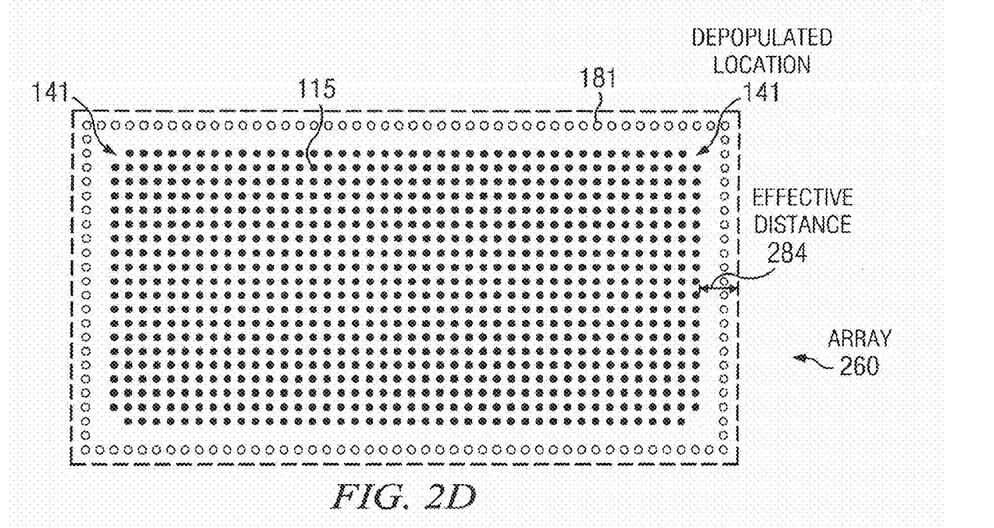
FIGS. 2D-G show depictions of exemplary TSV arrays which include different combinations of depopulation and dummy TSVs, according to disclosed embodiments.
Figure 2E:
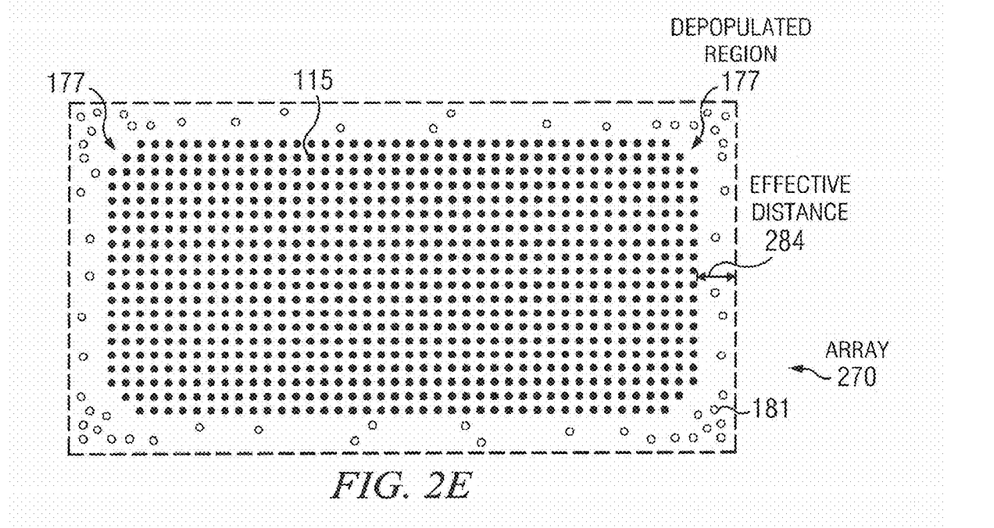

FIG. 2D shows a depiction of a TSV array 260 having one depopulated location in each corner and dummy TSVs 181 positioned to provide a protective ring or wall positioned within the effective distance 284 shown, according to a disclosed embodiment. FIG. 2E shows a depiction of a TSV array 270 having a depopulated region 177 comprising three depopulated location in each corner and generally randomly (i.e. aperiodically) positioned dummy TSVs 181, except for with an increased concentration of dummy TSVs 181 in the corners, according to a disclosed embodiment.

Figure 2F:
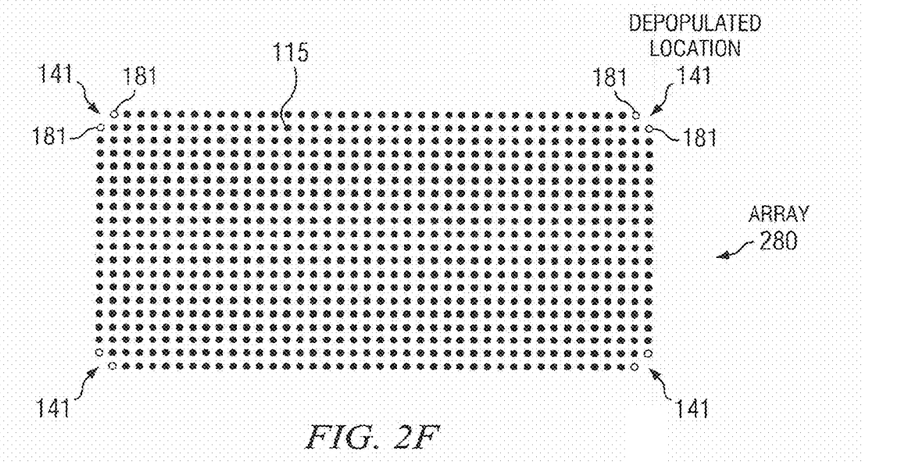
Figure 2G:
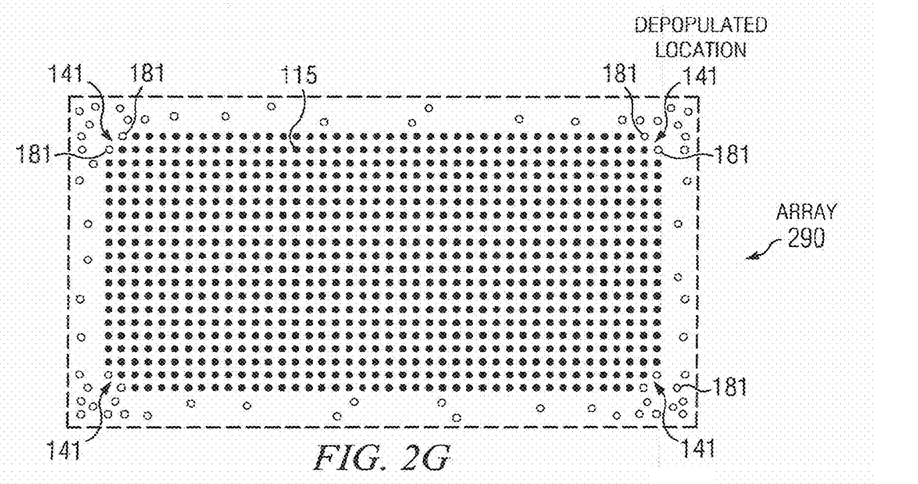

FIG. 2F shows a depiction of a TSV array 280 having one depopulated location 141 in each corner and a pair of dummy TSVs 181 positioned adjacent to the depopulated locations, according to a disclosed embodiment. FIG. 2G shows a depiction of a TSV array 290 based on TSV array 280 shown in FIG. 2F, with the addition of the dummy TSV pattern shown in FIG. 2F, according to a disclosed embodiment.

Dummy TSVs can be embodied in various ways. In a typical embodiment, the dummy TSV "stops" at M1 with a M1 TSV cover that electrically "floats" by not being connected to any other metallization within the IC, As shown in FIG. 3 described below, the area above the dummy TSVs can be used for back end of the line (BEOL) metal line routing.

Figure 3:
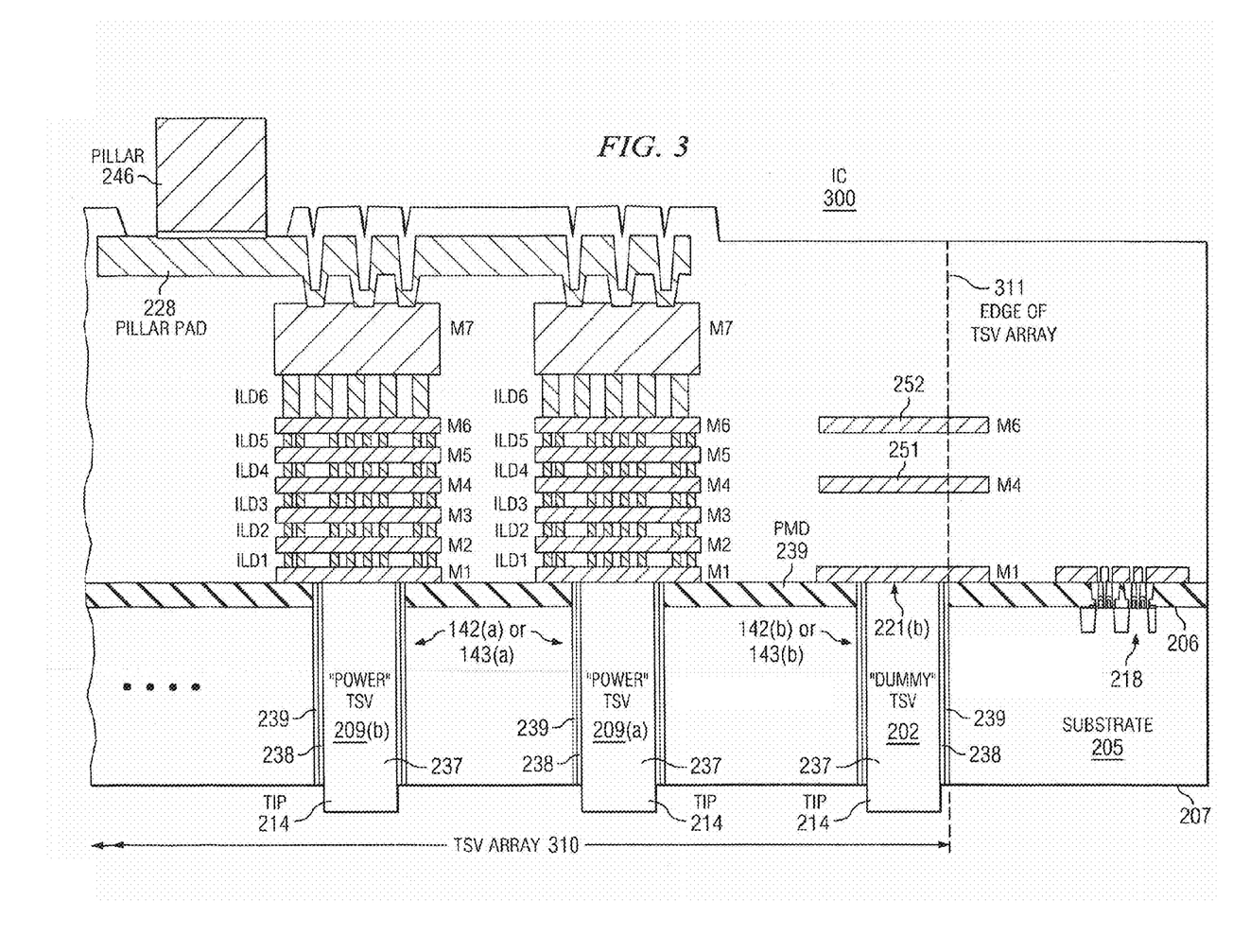
FIG. 3 is a simplified cross sectional depiction of a portion of an IC comprising a TSV array including power TSVs and at least one dummy TSV, according to a disclosed embodiment.

FIG. 3 is a simplified cross sectional depiction of a portion of an IC 300 comprising a TSV array 310 including electrically connected TSVs 115 described above shown as "power TSVs" 209(a) and 209(b) that provide power for the IC and dummy TSVs 181 described above shown as dummy TSV 202, according to a disclosed embodiment. Power TSVs 209(a) and 209(b) can be members of respective interior rows 142(a) or interior columns 143(a) described above for TSV array 310, while the dummy TSV 202 can be a member of an exterior row 142(b), exterior column 143(b), or a corner location as described above for TSV array 310. TSVs 209(a), 209(b), and 202 are shown including protruding TSV tips 214 that protrude a distance from the bottom side 207 of substrate 205, typically protruding a distance of from 5 to 50 μm measured from the bottom side 207.

IC 300 comprises a substrate 205 having a top side 206, such as a silicon or silicon germanium top surface, and a bottom side 207. IC 300 includes a plurality of metal interconnect levels generally comprising copper including a first to seventh metal interconnect level M1-M7 shown, a pre-metal dielectric (PMD) 239 between the top surface 206 and M1, and ILD layers comprising ILD1, ILD2, ILD3, ILD4, ILD5 and ILD6 shown comprising ILD dielectric material between respective ones of the plurality of metal interconnect levels M1 to M7. ILD material can comprise a low-k or an ultra low-k dielectric layer, and be different (or the same) material for each of the ILD1, ILD2, ILD3, ILD4, ILD 5 and ILD6 layers.

Although IC 300 shows both power TSVs 209(a) and (b) terminating at M1 that defines their TSV terminating metal interconnect level, in other embodiments the TSV terminating metal interconnect level can terminate at metal levels above M1, including the top level metal interconnect (M7 shown in FIG. 3). Active circuitry shown as transistor 218 is formed on top side 206 adjacent to the edge 311 of the TSV array 310. Although not shown, transistor 218 is coupled to other devices or components on IC 300 by one of the many possible connection options comprising M1, M2, M3 and M4, etc. and associated vias as shown in FIG. 3.

The power TSVs 209(a) and (b) can be seen providing a feed through the substrate 205 for connection on top side of the IC 300, such as to the pillar pad 228 having pillar 246 thereon. Power TSVs 209(a) and (b) generally provide a high current connection, such as VDD, VSS or Ground to a device above IC 300, with only the copper pillar 246 of the device mounted above IC 300 being shown in FIG. 3.

Dummy TSV 202 can be seen to be electrically unconnected. Since dummy TSV 202 is embedded below and terminates at M1, the volume above dummy TSV 202 becomes available for routing lines. IC 300 is shown including an M4 routing line 251 and an M6 routing line 252 above dummy TSV 202. Although not shown, routing lines 251 and 252 provide interconnection between various circuitry on IC 300.

TSVs 202 and 209(a) and (b) comprise TSV filler material (e.g., copper) 237 that can be seen to extend from M1 which functions as the TSV terminating metal interconnect level for TSVs 202 and 209(a) and (b) on IC 300 downward through the bottom surface 207. The TSV filler material 237 is shown surrounded by diffusion barrier metal (e.g., Ta, TaN, Ti, TiN, Mn, or Ru, or combinations thereof) 238 then an outer dielectric liner 239.

Figure 4A:
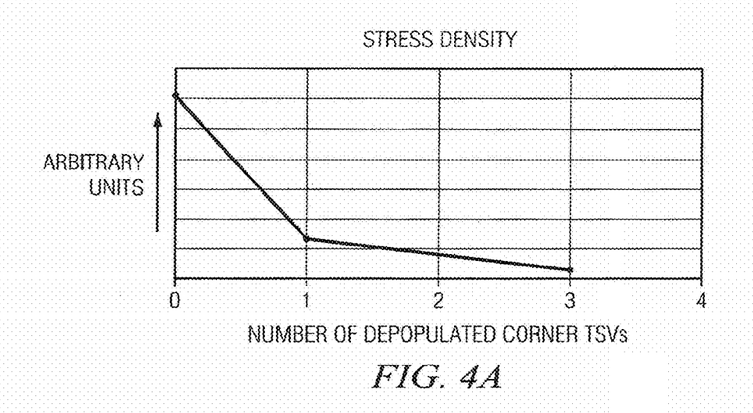
FIGS. 4A-C provide qualitative thermo-mechanical stress/strain modeling data showing the silicon stress, strain, and elastic energy density reduction effect of selective depopulation of the TSV array at its corners, respectively, according to a disclosed embodiment.
Figure 4B:
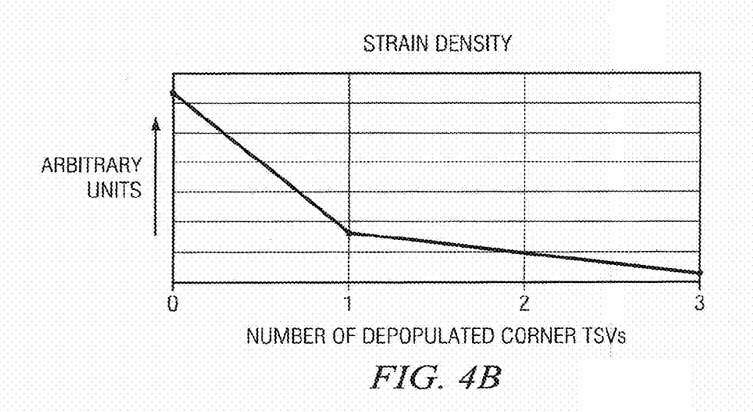
Figure 4C:
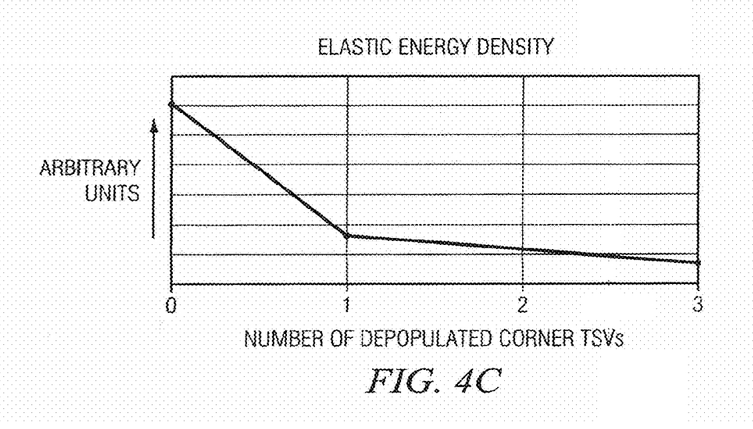

FIGS. 4A-C provide qualitative thermo-mechanical stress/strain modeling data showing the silicon stress, strain, and elastic energy density reduction effect of selective depopulation of the TSV array at the corners, respectively, according to a disclosed embodiment. The model conditions comprised a temperature of −65° C., with the TSV array having a 50 um TSV pitch. The magnitude of the stress, strain and elastic density increases with increasing TSV diameter and also increases with decreasing TSV pitch. A similar qualitative response is obtained when modeled at 260° C.

Although the y-axes are shown in arbitrary units, the modeling data clearly demonstrates the trend of a decreasing magnitude for stress, strain and elastic density with an increase in number of depopulated locations at the corners of the TSV array. The case for zero depopulated corner locations for a TSV array can be represented by the conventional rectangular TSV array shown in FIG. 1A.

Disclosed embodiments can be integrated into a variety of process flows to form a variety of devices and related products that include TSV arrays. Disclosed embodiments enables larger arrays than can currently be placed (for the case of rectangular arrays) and enable a larger operating temperature range for the IC. The substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. An integrated circuit (IC), comprising:
a substrate having a top side having active circuitry thereon including a plurality of metal interconnect levels including a first metal interconnect level and a top metal interconnect level having inter-level dielectric (ILD) layers between respective ones of said plurality of metal interconnect levels, and a bottom side, and
at least one TSV array comprising a plurality of TSVs with each TSV extending from said top side to said bottom side and comprising an electrically conductive filler material surrounded by a dielectric liner;
wherein said plurality of TSVs are positioned in rows including a plurality of interior rows and a pair of exterior rows and a plurality of columns including a plurality of interior columns and a pair of exterior columns;
wherein at least a portion of said plurality of TSVs in said array are electrically connected TSVs that are coupled to a TSV terminating metal interconnect level selected from said plurality of metal interconnect levels,
and wherein at least one of said pair of exterior rows or at least one of said pair of exterior columns include a lower number of said electrically connected TSVs compared to a maximum number of said electrically connected TSVs in said plurality of interior rows and said plurality of interior columns, respectively.

2. The IC of claim 1, wherein said electrically conductive filler material comprises copper and said substrate comprises silicon.

3. The IC of claim 1, wherein said TSV terminating metal interconnect level is said first metal interconnect level.

4. The IC of claim 1, wherein said TSV array includes a plurality of corners, and wherein said lower number of said electrically connected TSVs is provided by depopulation of at least one of said electrically connected TSVs in each of said corners.

5. The IC of claim 4, wherein said depopulation comprises depopulation of a plurality of said electrically connected TSVs in each of said corners.

6. The IC of claim 1, wherein said TSV array includes a plurality of corners, and wherein said lower number of said electrically connected TSVs is provided by at least a portion of one of said pair of exterior rows or at least a portion of one of said pair of exterior columns comprising dummy TSVs.

7. The IC of claim 4, further comprising at least one dummy TSV between an outer edge of said electrically connected TSVs and an effective distance outward from said outer edge comprising ≦3 times a pitch in said TSV array.

8. The IC of claim 7, wherein said at least one dummy TSV comprises at least one ring of said dummy TSVs circumscribing said electrically connected TSVs except at said corners.

9. The IC of claim 8, further comprising at least one dummy TSV disposed between said ring and said effective distance.

10. The IC of claim 9, wherein said at least one dummy TSV disposed between said ring and said effective distance comprises a plurality of said dummy TSV arranged aperiodically.

11. The IC of claim 6, wherein said IC includes at least one of said plurality of metal interconnect levels providing routing lines over said dummy TSVs.

12. The IC of claim 1, wherein said plurality of TSVs comprise protruding TSV tips, said protruding TSV tips protruding 5 to 50 µm from said bottom side.

13. The IC of claim 1, wherein said TSV array is a rectangular shaped TSV array.

14. An integrated circuit (IC), comprising:
- a substrate comprising silicon having a top side having active circuitry thereon including a plurality of metal interconnect levels including a first metal interconnect level and a top metal interconnect level having inter-level dielectric (ILD) layers between respective ones of said plurality of metal interconnect levels, and a bottom side, and
- at least one TSV array comprising a plurality of TSVs with each TSV extending from said top side to said bottom side and comprising copper surrounded by a dielectric liner, wherein said plurality of TSVs are positioned in rows including a plurality of interior rows and a pair of exterior rows and a plurality of columns including a plurality of interior columns and a pair of exterior columns;
- wherein at least a portion of said plurality of TSVs in said array are electrically connected TSVs that are coupled to a TSV terminating metal interconnect level selected from said plurality of metal interconnect levels;
- wherein at least one of said pair of exterior rows or at least one of said pair of exterior columns include a lower number of said electrically connected TSVs compared to a maximum number of said electrically connected TSVs in said plurality of interior rows and said plurality of interior columns, respectively;
- wherein said TSV array includes a plurality of corners, and
- wherein said lower number of said electrically connected TSVs is provided by depopulation of at least one of said electrically connected TSVs in each of said corners.

15. The IC of claim 14, wherein said lower number of said electrically connected TSVs is provided by at least a portion of one of said pair of exterior rows or at least a portion of one of said pair of exterior columns comprising dummy TSVs.

16. The IC of claim 14, further comprising at least one dummy TSV between an outer edge of said electrically connected TSVs and an effective distance outward from said outer edge comprising ≦3 times a pitch in said TSV array.

17. The IC of claim 14, wherein said TSV array is a rectangular shaped TSV array.

* * * * *